(12) United States Patent
Blodgett

(10) Patent No.: US 6,816,408 B2
(45) Date of Patent: Nov. 9, 2004

(54) MEMORY DEVICE WITH MULTI-LEVEL STORAGE CELLS

(75) Inventor: Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 10/414,318

(22) Filed: Apr. 15, 2003

(65) Prior Publication Data

US 2003/0202396 A1 Oct. 30, 2003

Related U.S. Application Data

(63) Continuation of application No. 09/758,476, filed on Jan. 11, 2001, now Pat. No. 6,587,372.

(51) Int. Cl.[7] ........................... G11C 16/04; G11C 16/06
(52) U.S. Cl. .............................. 365/185.03; 365/185.09
(58) Field of Search ...................... 365/185.03, 185.09, 365/185.29, 185.33, 230.06; 711/103

(56) References Cited

U.S. PATENT DOCUMENTS

| | | | | |
|---|---|---|---|---|
| 4,415,992 A | * | 11/1983 | Adlhoch | 365/207 |
| 5,043,940 A | * | 8/1991 | Harari | 365/185.03 |
| 5,163,021 A | * | 11/1992 | Mehrotra et al. | 365/185.03 |
| 5,283,761 A | * | 2/1994 | Gillingham | 365/189.07 |
| 5,440,505 A | * | 8/1995 | Fazio et al. | 365/185.03 |
| 5,455,801 A | * | 10/1995 | Blodgett et al. | 365/222 |
| 5,515,317 A | * | 5/1996 | Wells et al. | 365/185.03 |
| 5,566,125 A | * | 10/1996 | Fazio et al. | 365/185.03 |
| 5,574,879 A | * | 11/1996 | Wells et al. | 365/185.03 |
| 5,594,691 A | * | 1/1997 | Bashir | 365/185.03 |
| 5,596,526 A | * | 1/1997 | Assar et al. | 365/185.03 |
| 5,612,912 A | * | 3/1997 | Gillingham | 365/203 |
| 5,822,256 A | | 10/1998 | Bauer et al. | |
| 5,905,673 A | * | 5/1999 | Khan | 365/185.03 |
| 6,259,627 B1 | | 7/2001 | Wong | |
| 6,260,102 B1 | * | 7/2001 | Robinson | 711/103 |
| 6,396,742 B1 | | 5/2002 | Korsh et al. | |

* cited by examiner

Primary Examiner—Trong Phan
(74) Attorney, Agent, or Firm—TraskBritt

(57) ABSTRACT

The present invention comprises a memory array including multiple bit per cell memory cells and methods for operating same. The multiple bit per cell memory cells of the present invention have higher memory densities than conventional single bit per cell memory cells. Additionally, spare states in multiple bit per cell memory devices that remain unmapped to binary data bits may be advantageously used.

7 Claims, 8 Drawing Sheets

MEMORY DEVICE WITH MULTI-LEVEL STORAGE CELLS

CROSS-REFERENCE TO RELATED APPLICATION

This application is a continuation of application Ser. No. 09/758,476, filed Jan. 11, 2001, now U.S. Pat. 6,587,372, issued Jul. 1, 2003.

BACKGROUND OF THE INVENTION

Field of the Invention

The present invention relates generally to memory devices with storage cells capable of storing more than one bit of data, i.e., more than two voltage levels. More particularly, the present invention is a memory device with storage cells capable of storing 1.5 bits of data, or three voltage levels, and methods using same.

Most conventional memory devices, including programmable read-only memory (PROM), electrically-erasable PROM (EEPROM), flash EEPROM, random access memory (RAM), static RAM (SRAM), dynamic RAM (DRAM), synchronous DRAM (SDRAM) and the like, are capable of storing a single bit of data in a single memory cell. The memory cell of a conventional memory device may represent a data bit with a logical state of true or high voltage in the presence of stored charge in the memory cell. Conversely, the absence of charge may be representative of a data bit with a logical state false or low voltage.

Memory devices with more than one bit of data per cell are also known in the art. For example, U.S. Pat. No. 5,043,940 to Harrari defines multi-level states in a single memory cell in terms of the threshold voltage $V_t$ of a split-channel flash EEPROM memory cell. Harrari discloses using four discrete voltage levels to store two bits of data per memory cell by applying multiple programming pulses to each memory cell. U.S. Pat. No. 5,163,021 to Mehrota et al. also discloses a multi-level memory system wherein each memory cell is capable of four threshold voltage levels.

U.S. Pat. No. 5,566,125 to Fazio et al. discloses a method and circuitry for storing discrete amounts of charge in a single flash memory cell. Fazio et al. also discloses programming a flash memory cell to one of at least three amounts of charge, wherein the amount of charge placed in the flash memory cell is increased by increasing the voltage level of a programming pulse applied to the memory cell.

U.S. Pat. No. 5,574,879 to Wells et al. discloses addressing modes for a dynamic single bit per cell to multiple bit per cell memory. Wells et al. also discloses a memory system containing switch control for selecting between standard cell addressing modes and multi-level cell addressing modes. U.S. Pat. No. 5,594,691 to Bashir discloses address transition detection sensing circuitry for flash memory having multi-bit cells and methods for using same. U.S. Pat. No. 5,612,912 to Gillingham discloses a method of sensing and restoring voltages in a multi-level DRAM cell.

However, none of these patents appears to disclose memory devices, apparatuses, systems and methods of using multi-bit memory cells to provide parity bits or methods of storing and retrieving partial bits of data from a single memory cell. Thus, there exists a need in the art for memory devices, apparatuses, systems and methods of using multi-bit memory cells to provide parity bits in a memory device based on multiples of 8 bits.

BRIEF SUMMARY OF THE INVENTION

The present invention comprises memory devices, apparatuses and systems including multiple bit per cell memory cells and methods for using same. The multiple bit per cell memory cells of the present invention have higher memory densities than conventional single bit per cell memory cells. Additionally, spare states in multiple bit per cell memory devices that remain unmapped to binary data bits may be advantageously used for storing information. While multiple bit per cell memory cells having more than three states are contemplated, a memory cell with three states is preferable to a memory cell with four or more states because of the added difficulty in distinguishing four or more memory states in a given voltage range versus only three states, i.e., reliability decreases with narrower voltage margins between cell states.

An embodiment of a multiple bit per cell memory device in accordance with the present invention includes a command and address decode block connected to a command bus and an address bus, a data input/output (I/O) block connected to the command and address decode block and connected to a data bus, and a memory array of multiple bit memory cells connected to the command and address decode block and the data I/O block.

An embodiment of a memory card in accordance with the present invention includes a substrate for mounting and interconnecting integrated circuits, and at least one multiple bit per cell memory device integrated circuit mounted on the substrate, wherein the at least one multiple bit per cell memory device integrated circuit includes a command and address decode block connected to a command bus and an address bus, a data input/output (I/O) block connected to the command and address decode block and connected to a data bus, and a memory array of multiple bit memory cells connected to the command and address decode block and the data I/O block.

An embodiment of a computer system in accordance with the present invention includes an input device, an output device, a processor connected to the input device and the output device, a memory device connected to the processor device and including at least one multiple bit per cell memory device, wherein each of the at least one multiple bit per cell memory device includes a command and address decode block connected to a command bus and an address bus, a data input/output (I/O) block connected to the command and address decode block and connected to a data bus, and a memory array of multiple bit memory cells connected to the command and address decode block and the data I/O block.

An embodiment of a semiconductor substrate in accordance with the present invention includes at least one multiple bit per cell memory device mounted on the substrate, wherein the at least one multiple bit per cell memory device includes a command and address decode block connected to a command bus and an address bus, a data input/output (I/O) block connected to the command and address decode block and connected to a data bus, and a memory array of multiple bit memory cells connected to the command and address decode block and the data I/O block.

A method embodiment for mapping states of a multiple bit per cell memory device to binary data bits is disclosed. Method embodiments for operating a multiple bit per cell memory device are also disclosed.

These devices, apparatuses, systems and methods and attendant advantages of the present invention will be readily understood by reading the following detailed description in conjunction with the accompanying figures of the drawings.

BRIEF DESCRIPTION OF THE SEVERAL VIEWS OF THE DRAWINGS

In the drawings, which illustrate what is currently regarded as the best mode for carrying out the invention and in which like reference numerals refer to like parts in different views or embodiments.

DETAILED DESCRIPTION OF THE INVENTION

U.S. Pat. No. 5,566,125 to Fazio et al., U.S. Pat. No. 5,574,879 to Wells et al., U.S. Pat. No. 5,594,691 to Bashir and U.S. Pat. No. 5,612,912 to Gillingham are each expressly incorporated herein by reference for all purposes. The primary advantage of the multiple bit per cell memory cells disclosed herein is greater memory density relative to conventional single bit per cell memory cells or, alternatively, reduced semiconductor die real estate relative to conventional single bit per cell memory cells.

Figure 1:
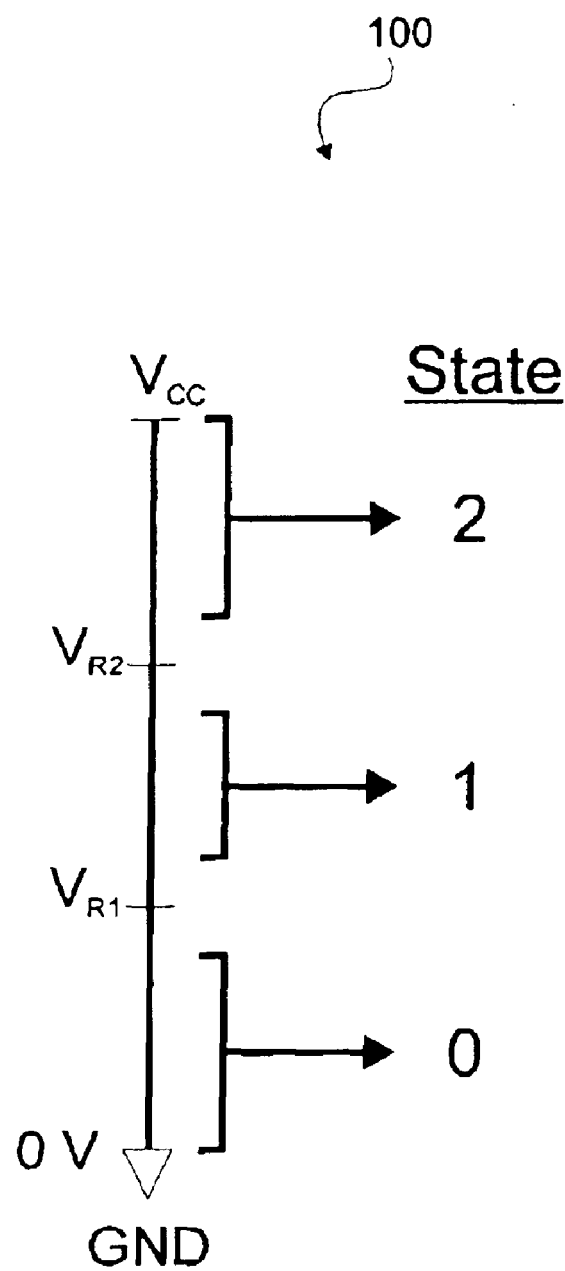
FIG. 1 is a voltage diagram of an embodiment of a multiple bit memory cell in accordance with the present invention.

FIG. 1 is a voltage diagram of an embodiment of a multiple bit memory cell in accordance with the present invention. In particular, FIG. 1 illustrates a 1.5 bit memory cell 100 in accordance with the present invention. The 1.5 bit memory cell 100 includes three states, 0, 1 and 2, corresponding roughly to the voltage regions between a power source, $V_{CC}$, and ground potential, GND, as indicated. The three states are separated by two reference voltages, $V_{R1}$ and $V_{R2}$. Memory devices including memory cells with 2 bits per cell (or four states) in Flash EEPROM and DRAM technologies and methods for manufacturing same are known in the art. For this reason, further detail regarding the storage of more than two states in a memory cell will not be included herein.

Table 1 below is an exemplary mapping of two 1.5 bit memory cells, CELL0-CELL1, each with three states, to three binary bits, BIT0-BIT2. In order to retrieve data from a cell which stores a fraction of a data bit, it is necessary to read at least two cells. The nine possible states of the two cells are mapped into eight data states representing three binary data bits, and one spare state. The ninth state, State 8, is a spare state. The spare state may be used as an erased or unwritten state, or as an error state (data is invalid).

TABLE 1

| State | CELL0 | CELL1 | BIT2 | BIT1 | BIT0 |
|---|---|---|---|---|---|
| 0 | 0 | 0 | 0 | 0 | 0 |
| 1 | 0 | 1 | 0 | 0 | 1 |
| 2 | 0 | 2 | 0 | 1 | 0 |
| 3 | 1 | 0 | 0 | 1 | 1 |

TABLE 1-continued

| State | CELL0 | CELL1 | BIT2 | BIT1 | BIT0 |
|---|---|---|---|---|---|
| 4 | 1 | 1 | 1 | 0 | 0 |
| 5 | 1 | 2 | 1 | 0 | 1 |
| 6 | 2 | 0 | 1 | 1 | 0 |
| 7 | 2 | 1 | 1 | 1 | 1 |
| 8 | 2 | 2 | X | X | X |

The example mapping shown in Table 1, above, may be extended to any number of cells, for example a mapping of six 1.5 bit memory cells, CELL0-5, to nine binary data bits, BIT0-8. In this example there are 729 possible states in a group of six, three-state memory cells. The six 1.5 bit memory cells are referred to herein as a "group of 1.5 bit memory cells" or alternatively as a "group of three-state memory cells." The nine binary data bits, BIT0-8, mapped from the group of 1.5 bit memory cells may be arranged as eight data bits and one parity bit, states 0–511. Note that there are extra or "spare states," specifically, States 512–728. These 217 spare states may be powered up in an invalid data state, or may be erased into the invalid data state. Groups of 1.5 bit memory cells may be arranged in any suitable topology to form multiple bit per cell memory devices.

Figure 2:
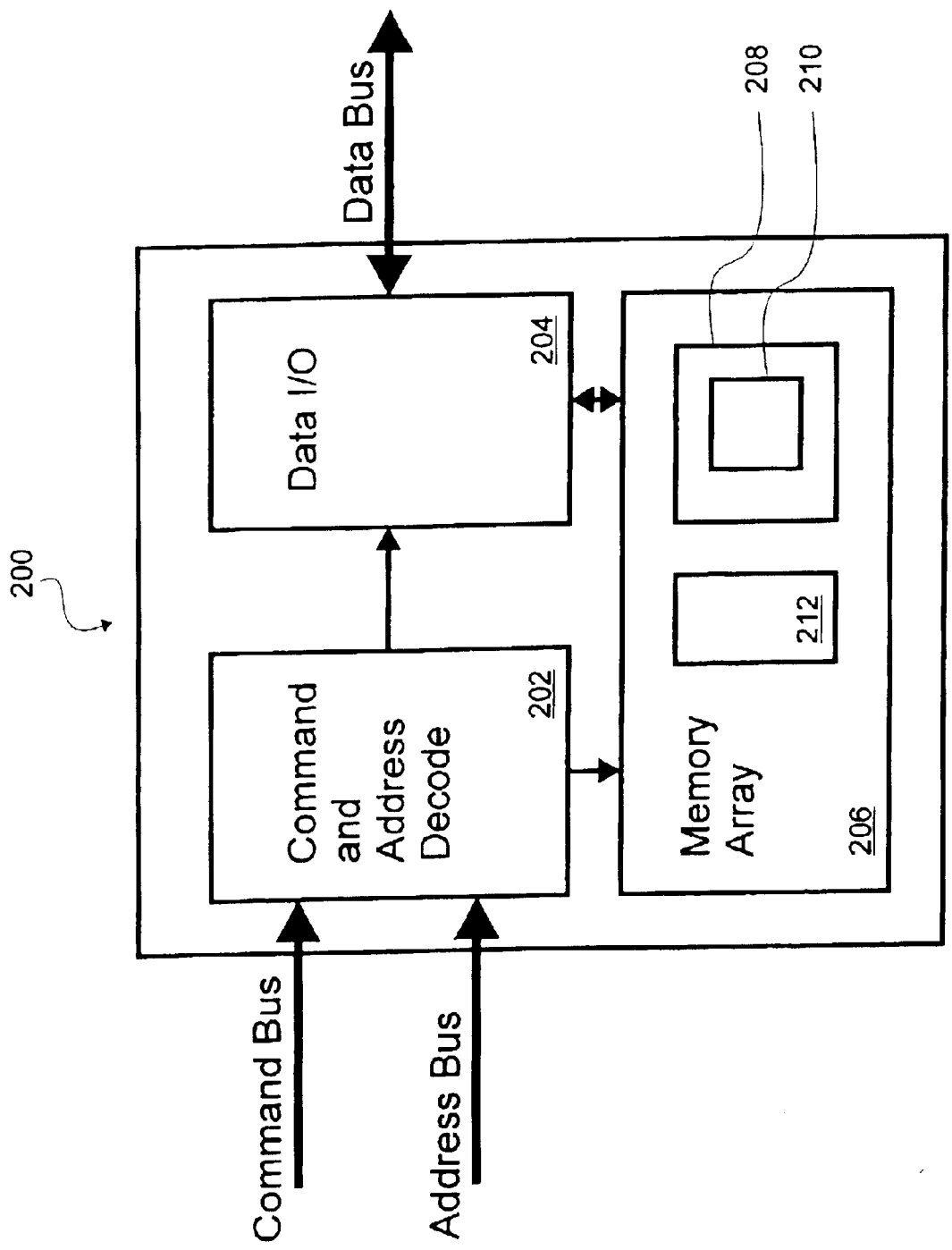
FIG. 2 is a block diagram of a multiple bit per cell memory device in accordance with the present invention.

FIG. 2 is a block diagram of a multiple bit per cell memory device 200 in accordance with the present invention. The multiple bit per cell memory device 200 includes a command and address decode block 202 connected to a data input/output (I/O) block 204, and a memory array 206 connected to both the command and address decode block 202 and the data I/O block 204. The command and address decode block 202 may be connected externally to a command bus and to an address bus. The data I/O block 204 may be connected externally to a bidirectional data bus. The memory array 206 further includes at least one group 208 of multiple bit per cell memory cells 210 and a parity generator 212. Although only one group 208 and one multiple bit per cell memory cell 210 are shown, one of ordinary skill in the art will recognize that the group 208 and multiple bit per cell memory cell 210 may be arranged and scaled to accommodate virtually any configuration of memory array. The parity generator 212 allows on-chip parity generation and checking for any memory states within the multiple bit per cell memory cells 210 that are invalid data states. Parity generator 212 may also include circuitry for generating error-correcting codes, applying the generated error-correcting codes, detecting errors and correcting errors detected.

Multiple bit per cell memory cell 210 may be a 1.5 bit per cell memory cell as depicted in FIG. 1. A group 208 may contain any number of multiple bit per cell memory cells 210. Advantageously, group 208 may include six 1.5 bit per cell memory cells mapped to eight data bits and one parity bit.

Other multiple bit per cell memory cells are within the scope of the present invention, for example, and not by way of limitation, a five state, 2.5 bit per cell memory cell. The more states per memory cell, the greater the memory density of the memory device. However, as noted above, for a given rail-to-rail voltage differential (i.e., ground potential, GND, to supply voltage, $V_{CC}$), a three-state memory cell is easier to reliably manufacture than a memory cell with four or more states because the voltage thresholds that separate the various states are wider for a three-state memory cell than for higher-state memory cells.

The multiple bit per cell memory cell 210 of the present invention may be used in conventional memory device architectures such as dynamic random access memory (DRAM), synchronous DRAM (SDRAM), double data rate SDRAM (DDR SDRAM), RAMBUS® DRAM (RDRAM®), extended data-out DRAM (EDO DRAM), fast-page-mode DRAM (FPM DRAM), static random access memory (SRAM), SyncBurst™ SRAM, Zero Bus Turnaround™ SRAM (ZBT™ SRAM), Quad Data Rate™ SRAM (QDR™ SRAM), DDR synchronous SRAM (DDR SRAM) and nonvolatile electrically block-erasable programmable read only memory (Flash).

Figure 3:
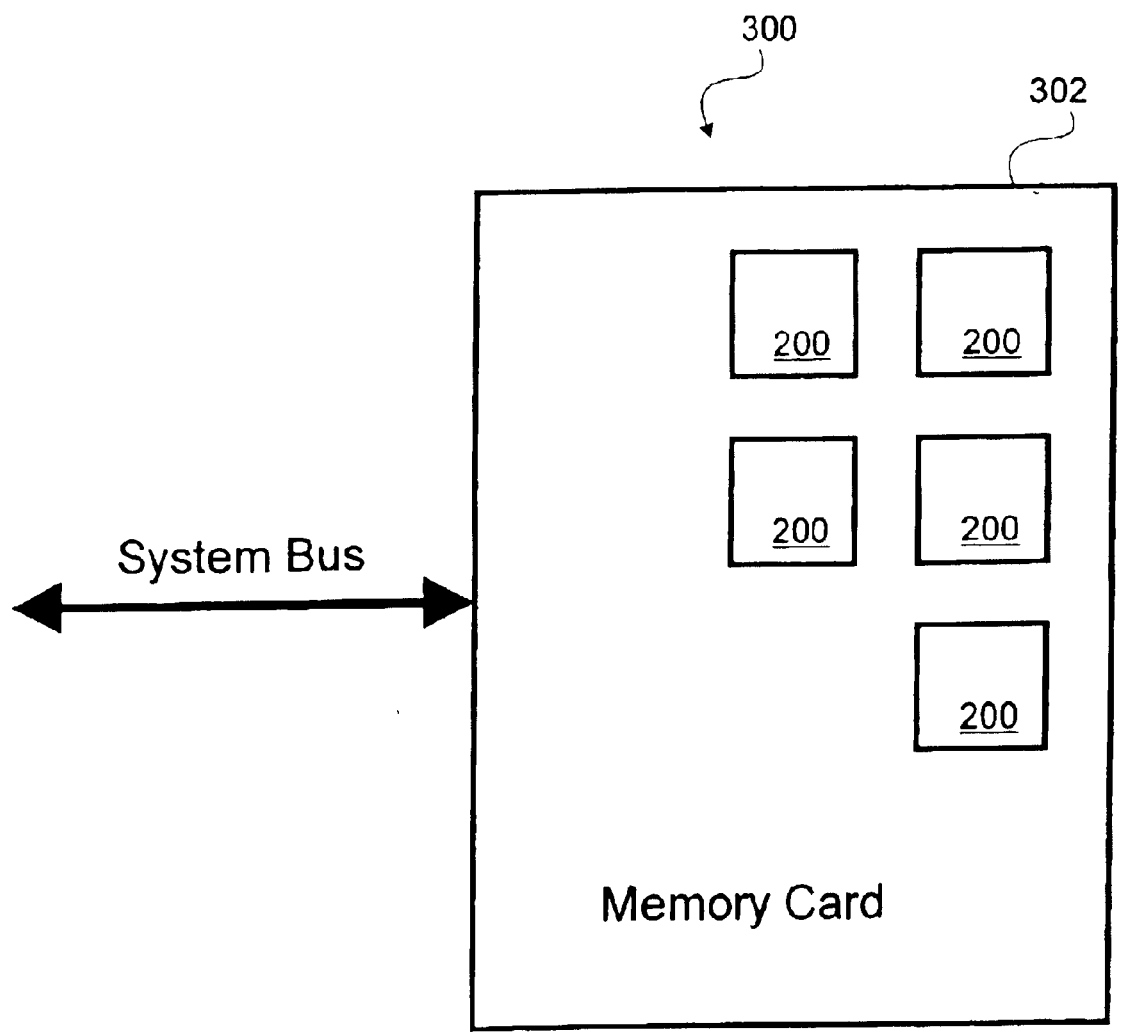
FIG. 3 is a block diagram of a memory card including at least one multiple bit per cell memory device of the present invention.

FIG. 3 is a block diagram of a memory card 300 including at least one multiple bit per cell memory device 200 of the present invention. The term "memory card" is synonymous with "memory circuit card" or "memory module" as known to one of ordinary skill in the art. The memory card 300 of FIG. 3 is shown with a substrate 302 and five multiple bit per cell memory devices 200. However, any number of multiple bit per cell memory devices 200 may be included on a given memory card 300. Memory card 300 also includes an interface to external devices. FIG. 3 illustrates a system bus interface; however, a memory bus or other dedicated electrical bus interface is also contemplated within the scope of the invention. Substrate 302 may be a circuit card or other substrate for mounting integrated circuits.

The memory card 300 may be configured for compatibility with conventional memory module architectures, for example and not by way of limitation, single in-line memory module (SIMM), RAMBUS® in-line memory module (RIMM™), dual in-line memory module (DIMM), accelerated graphics port (AGP) in-line memory module (AIMM), and small-outline DIMM (SODIMM).

Figure 4:
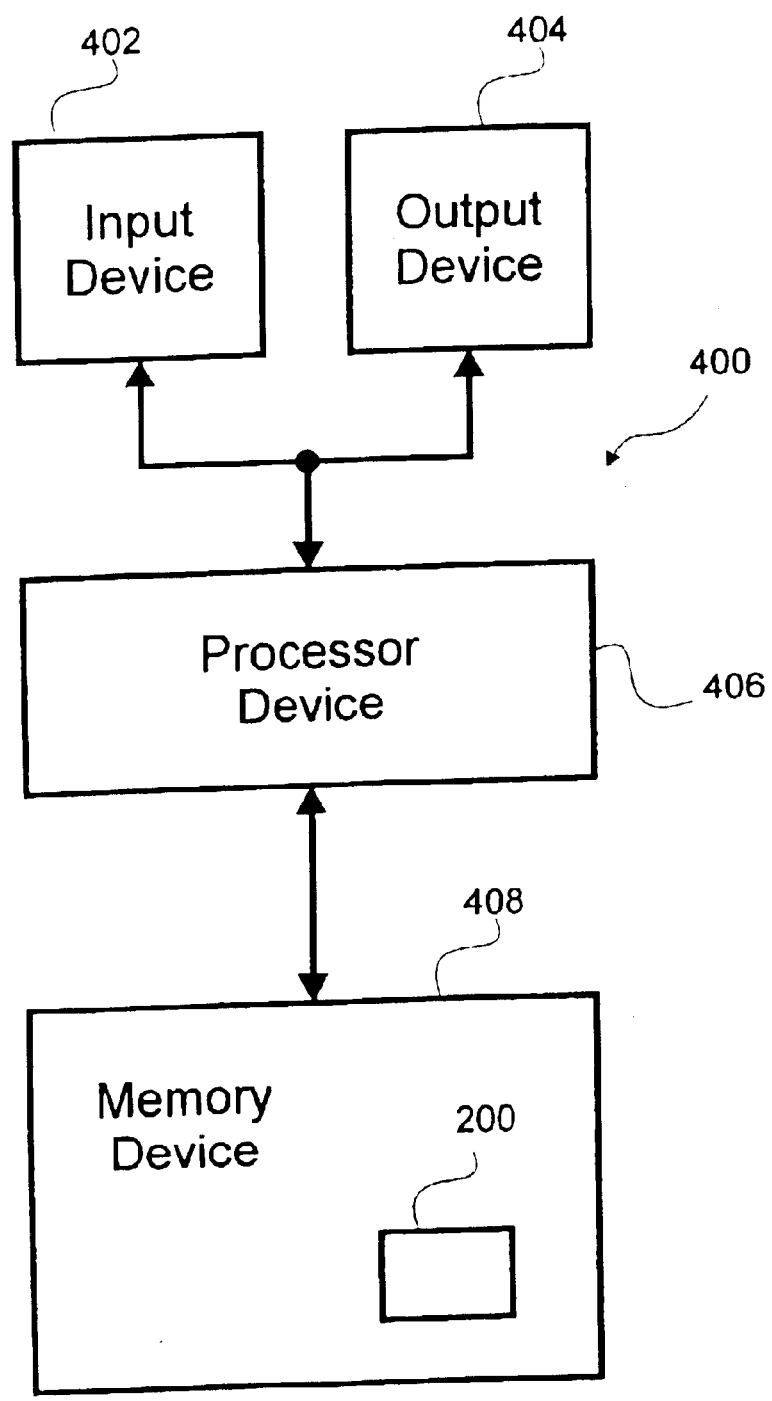
FIG. 4 is a block diagram of a computer system including the multiple bit per cell memory device of the present invention.

FIG. 4 is a block diagram of a computer system 400 including the multiple bit per cell memory device 200 of the present invention. Computer system 400 includes an input device 402, an output device 404, a processor device 406 connected to the input device 402 and the output device 404, and a memory device 408 connected to the processor device. Input device 402 may be a keyboard, mouse, joystick or other computer input device. Output device 404 may be a monitor, printer or storage device, such as a disk drive. Processor device 406 may be a microprocessor or a circuit card including hardware for processing computer instructions.

Memory device 408 includes at least one multiple bit per cell memory device 200 in accordance with the present invention. Memory device 408 may be a memory card 300 as described above and shown in FIG. 3.

Figure 5:
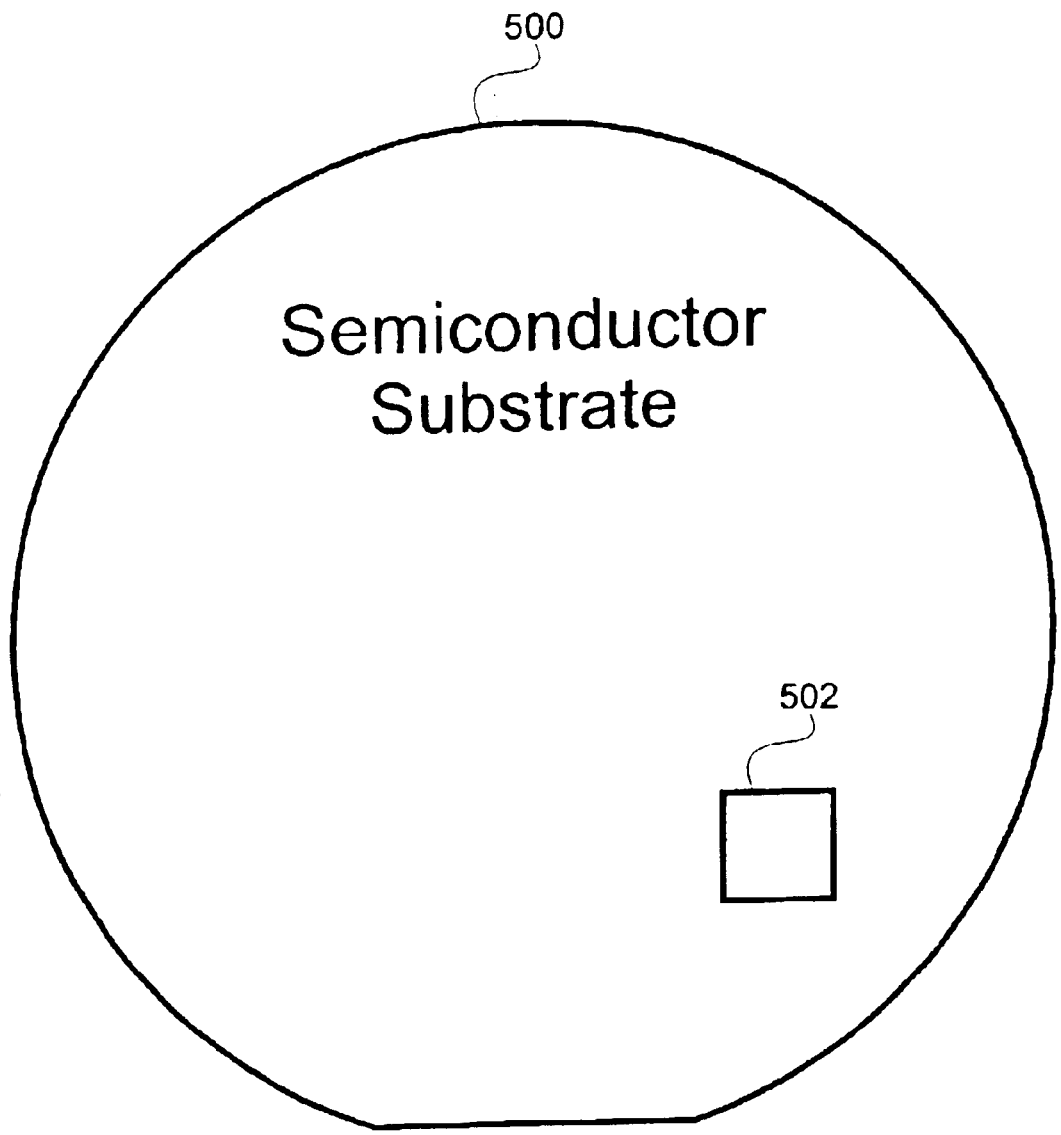
FIG. 5 is a plan view of a semiconductor substrate including at least one integrated circuit die having at least one multiple bit per cell memory device in accordance with the present invention.

FIG. 5 is a plan view of a semiconductor substrate 500 including at least one integrated circuit die 502 having at least one multiple bit per cell memory device 200 in accordance with the present invention.

The semiconductor technology employed is not a limiting factor in the application of the multiple bit per cell memory device of the present invention. While silicon is the preferred bulk semiconductor material for commercial electronic devices, gallium arsenide and indium phosphide substrates may also be employed. Of course, it will be understood that the multiple bit per cell memory device of the present invention may be fabricated on other semiconductor substrates as well, including, for example, silicon-on-glass (SOG) substrates, silicon-on-insulator (SOI) substrates, and silicon-on-sapphire (SOS) substrates.

Figure 6:
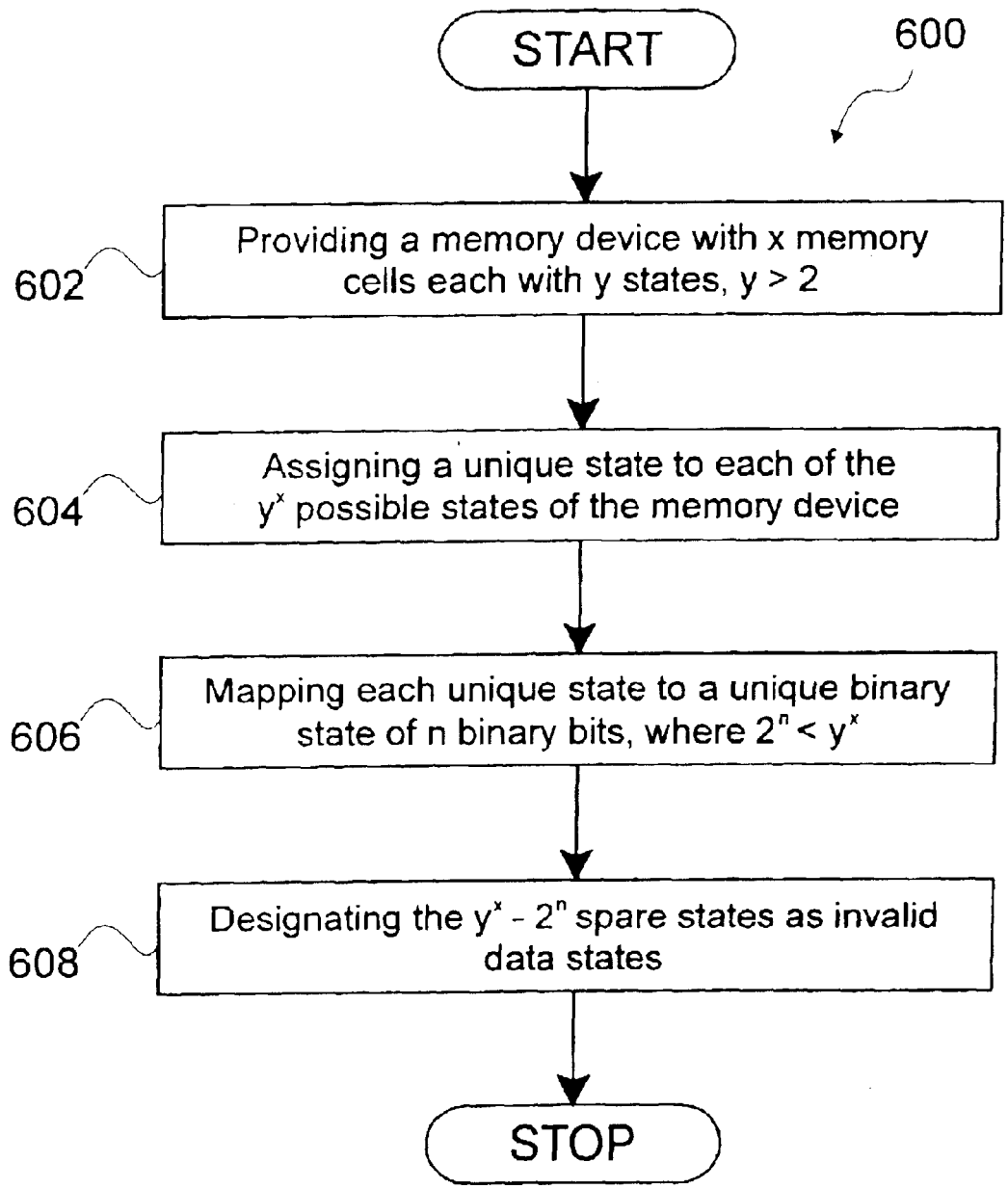
FIG. 6 is a flow chart of a method of mapping the unique states of a multiple bit per cell memory cell to unique states of binary data bits and assigning spare states for erased, default or invalid data states.

FIG. 6 is a flow chart of a method 600 for mapping the unique states of a multiple bit per cell memory cell to unique states of binary data bits and assigning spare states as invalid data states in accordance with the present invention. The method 600 includes providing 602 a memory device with x memory cells, each with y states, assigning 604 a unique state to each of the $y^x$ possible states of the memory device, mapping 606 each unique state to a unique binary state of n binary bits, where $2^n < y^x$ and n is an integer, and designating 608 the $y^x - 2^n$ spare states as invalid data states. As an example of the above method, consider a multiple bit per cell memory device with 6 cells (x=6), each memory cell with 3 states (y=3), there are $3^6 = 729$ unique states ($y^x$). To satisfy the inequality, $2^n < y^x$, for the largest integer n, select n=9 (i.e., 512<729). The remaining $y^x - 2^n$ or 729−512=217 spare states may be designated as erased, default, or invalid data states.

Figure 7:
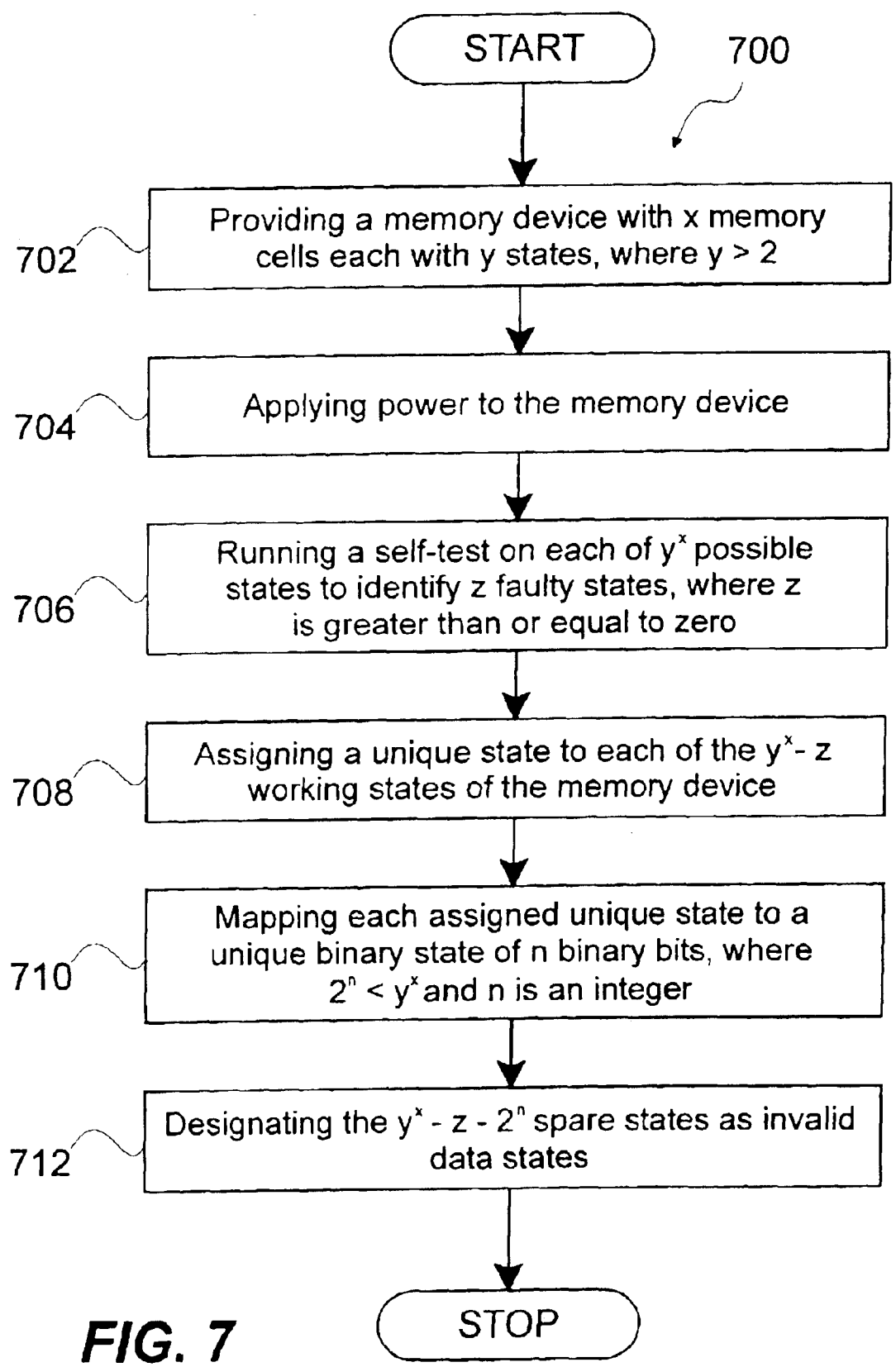
FIG. 7 is a flow chart of a method of operating a multiple bit per cell memory device in accordance with the invention.

FIG. 7 is a flow chart of a method 700 of operating a multiple bit per cell memory device in accordance with the present invention. The method 700 includes providing 702 a multiple bit per cell memory device with x memory cells, each with y states, where y>2, applying power 704 to the multiple bit per cell memory device, running 706 a self-test on each of $y^x$ possible states of the memory device to identify z faulty states, where z≧0, assigning 708 a unique state to each of the $y^x - z$ working states of the memory device, mapping 710 each assigned unique state to a unique binary state of n binary bits, where $2^n < y^x$ and n is an integer, and designating 712 the $y^x - z - 2^n$ spare states for erased, default, or invalid data states.

Figure 8:
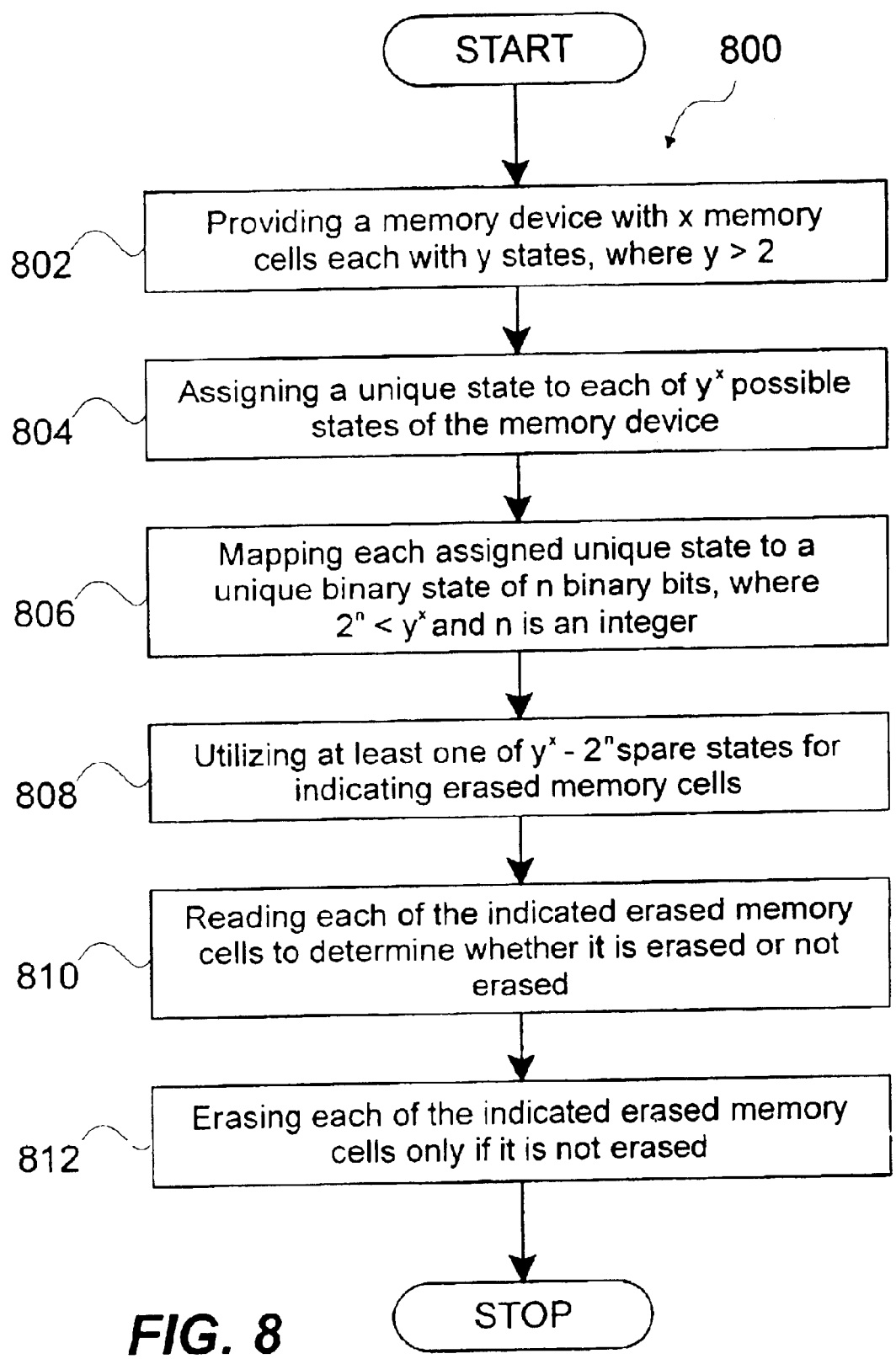
FIG. 8 is a flow chart of a method of erasing data in a multiple bit per cell memory device in accordance with the present invention.
Figure 5:
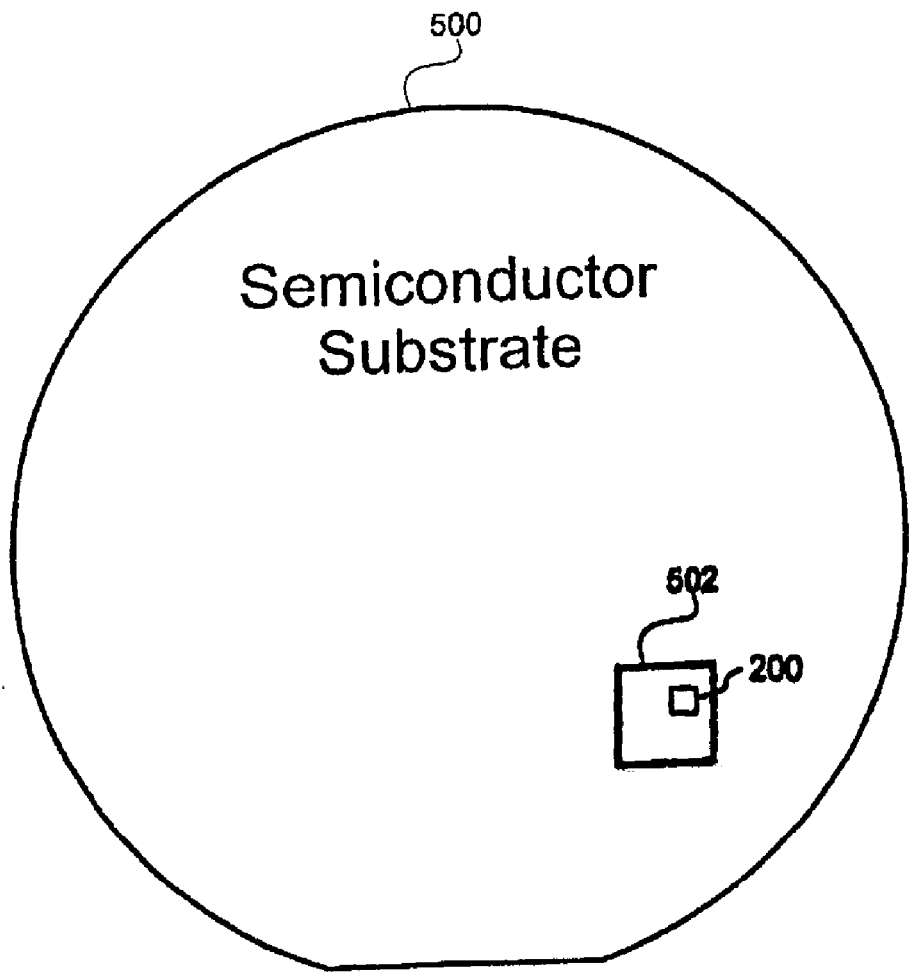

FIG. 8 is a flow chart of a method 800 of erasing data in a multiple bit per cell memory device in accordance with the present invention. Method 800 includes providing 802 a multiple bit per cell memory device with x multiple bit per cell memory cells, each with y states, assigning 804 a unique state to each of $y^x$ possible states of the multiple bit per cell memory device, mapping 806 each assigned unique state to a unique binary state of n binary bits, where $2^n < y^x$ and n is an integer, utilizing 808 at least one of $y^x - 2^n$ spare states for indicating erased memory cells, reading 810 each of the indicated erased memory cells to determine whether it is erased or not erased, and erasing 812 each of the indicated erased memory cells only if it is not erased.

Although this invention has been described with reference to particular embodiments, the invention is not limited to these described embodiments. Rather, the invention is limited only by the appended claims, which include within their scope all equivalent devices or methods that operate according to the principles of the invention as described herein.

What is claimed is:

1. A memory array, comprising:
   a plurality of memory cells each configured with greater than two information states, the greater than two information states of each of the plurality of memory cells being combinatorially mapped to a plurality of memory states which are further mapped to both a lesser plurality of valid data states corresponding to a plurality of binary data bits and one or more invalid data states; and
   a parity generator operably coupled to the plurality of memory cells for generating one or more parity bits representative of and for associating with the plurality of binary data bits.

2. The memory array of claim 1, wherein the one or more invalid data states are configured as spare states for indicating a status of the plurality of memory cells.

3. The memory array of claim 2, wherein one or more of the spare states are configured to specify an erased status of the plurality of memory cells.

4. The memory array of claim 3, wherein the plurality of memory cells are each configured to erase when the erased status indicates the plurality of memory cells as not erased.

5. The memory array of claim 1, wherein the plurality of memory cells comprises a plurality of 1.5 bit memory cells.

6. The memory array of claim 4, wherein the memory array further comprises a plurality of groups of 1.5 bit memory cells.

7. The memory array of claim 1, wherein the parity generator is further configured to identify the one or more invalid data states from among the plurality of memory states.

* * * * *

UNITED STATES PATENT AND TRADEMARK OFFICE
CERTIFICATE OF CORRECTION

PATENT NO. : 6,816,408 B2
APPLICATION NO. : 10/414318
DATED : November 9, 2004
INVENTOR(S) : Greg A. Blodgett It is certified that error appears in the above-identified patent and that said Letters Patent is hereby corrected as shown below:

The sheet of drawing consisting of figure 5 should be deleted to appear as per attached figure 5.

COLUMN 4, LINE 13, change "CELLO-5," to --CELL0-5,--

Signed and Sealed this

Twentieth Day of November, 2007

JON W. DUDAS
*Director of the United States Patent and Trademark Office*